United States Patent
Tixhon

(10) Patent No.: US 6,881,505 B2
(45) Date of Patent: Apr. 19, 2005

(54) COATED SUBSTRATE WITH HIGH REFLECTANCE

(75) Inventor: Eric Tixhon, Crisnee (BE)

(73) Assignee: Glaverbel, Brussels (BE)

( * ) Notice: Subject to any disclaimer, the term of this patent is extended or adjusted under 35 U.S.C. 154(b) by 0 days.

(21) Appl. No.: 10/177,015

(22) Filed: Jun. 24, 2002

(65) Prior Publication Data

US 2002/0182421 A1 Dec. 5, 2002

Related U.S. Application Data

(63) Continuation-in-part of application No. 09/423,337, filed on Nov. 22, 1999, now Pat. No. 6,423,414.

(30) Foreign Application Priority Data

Mar. 20, 1998 (GB) ............................................. 9806027

(51) Int. Cl.⁷ .............................. B32B 9/00; B01J 23/00
(52) U.S. Cl. ........................ 428/701; 428/428; 428/432; 428/702; 502/350
(58) Field of Search ................................. 428/426, 428, 428/432, 688, 689, 702; 502/350

(56) References Cited

U.S. PATENT DOCUMENTS

| | | | |
|---|---|---|---|
| 3,531,313 A | | 9/1970 | Dates |
| 4,900,634 A | | 2/1990 | Terneu et al. |
| 5,780,149 A | | 7/1998 | McCurdy et al. |
| 6,013,372 A | * | 1/2000 | Hayakawa et al. ...... 428/411.1 |
| 6,027,766 A | * | 2/2000 | Greenberg et al. .......... 427/226 |
| 6,071,606 A | * | 6/2000 | Yamazaki et al. ........... 428/325 |
| 6,423,414 B1 | * | 7/2002 | Legrand et al. ............. 428/426 |

FOREIGN PATENT DOCUMENTS

| | | |
|---|---|---|
| EP | 0 275 662 | 7/1998 |
| FR | 2 348 166 | 11/1977 |
| FR | 2 648 453 | 12/1990 |
| GB | 1 455 148 | 11/1976 |
| GB | 2 078 213 | 1/1982 |
| GB | 2 200 139 | 7/1988 |
| GB | 2 302 101 | 1/1997 |
| GB | 2 302 102 * | 1/1997 |
| GB | 2 302 102 A | 1/1997 |
| WO | 97/25287 | 7/1997 |

\* cited by examiner

*Primary Examiner*—Archene Turner
*Assistant Examiner*—G. Blackwell-Rudasill
(74) *Attorney, Agent, or Firm*—Piper Rudnick LLP; Jerold I. Schneider

(57) ABSTRACT

A transparent coated substrate with rather high reflectance, especially for use as in exterior glazing panels for buildings or automotives, is provided by a substrate carrying a coating stack comprising a pyrolytically-formed main layer containing oxide of tin and an outer layer comprising $TiO_2$, whereby the so-coated substrate has a reflectance (RL) of more than 10%. The coated substrate advantageously shows photocatalytic and hydrophilic properties.

29 Claims, No Drawings

COATED SUBSTRATE WITH HIGH REFLECTANCE

CROSS-REFERENCE TO RELATED APPLICATIONS

The application is based on, and claims priority from, United Kingdom Application No. 98 06027.0 filed 20 Mar., 1998 and is a continuation-in-part of U.S. application Ser. No. 09/243,337, filed 22 Nov., 1999, now U.S. Pat. No. 6,423,414, the disclosures of which are hereby incorporated by reference.

The present invention relates to a coated substrate with relatively high reflectance and photocatalytic properties. It is especially concerned with transparent glass substrates bearing a coating comprising a main layer of oxides of tin, (eventually doped with antimony and/or fluorine) and an outer layer mainly of titanium oxide and with the use of such substrates in exterior glazing panels for buildings or for the automotive industry.

Although architects seeking glazing panels for use in buildings have traditionally tended to favour panels with low levels of reflection, a changing perception of the aesthetic appeal has led to increasing demands for panels with higher levels of reflection but without the glare as viewed from outside which is associated with very high levels of reflection. The panels may also be required to have other qualities such as providing protection for occupants of the building against solar radiation and the associated overheating (solar screening properties).

There is also increasing search to provide glazing with additional functions such as self-cleaning properties and hydrophilic properties. Some materials called "photocatalytic" and based on particular metal oxides are known for their ability to degrade contamination upon exciting radiations, in particular UV radiations.

The panels comprise at least one sheet of a transparent substrate material, typically soda-lime glass, with a thin coating on one or more of the sheet faces to modify, amongst other, the opto-energetic and physico-chemical properties of the sheet and the panel as a whole. A huge variety of prior proposals have been made for the coating, according to the specific properties sought. The coating may comprise a stack of several discrete layers chosen with appropriate compositions and thicknesses to complement their respective effects. A persistent problem in choosing the respective layers is that a layer adopted for one purpose may adversely change the effect of other layers.

Tin oxide ($SnO_2$) has been widely used as a coating material, often in combination with other metal oxides. Coatings comprising tin oxide with a small proportion of antimony oxide have proved especially attractive for anti-solar purposes.

Our GB patent 1455148 teaches a method for pyrolytically forming a coating of one or more oxides (e.g. $ZrO_2$, $SnO_2$, $Sb_2O_3$, $TiO_2$, $Co_3O_4$, $Cr_2O_3$, $SiO_2$) on a substrate, primarily by spraying compounds of a metal or silicon, so as to modify the light transmission and/or light reflection of the substrate. Our GB patent 2078213, which relates to a method for pyrolytically forming a coating by two separate sprays to achieve high rates of coating build-up, discloses tin oxide coatings doped with fluorine or antimony. Our GB patent 2200139 relates to forming a pyrolytic tin oxide coating from a precursor containing at least two additives such as oxidising agents, sources of fluorine and sources of metal.

The use of a tin oxide coating with a small proportion of antimony oxide has been found to offer several advantageous combinations of optical and energy properties. Our GB patent applications 2302101 ('101) and 2302102 ('102) describe anti-solar glazing panels comprising a pyrolytic coating layer of oxides of tin and antimony in which the Sb/Sn molar ratio is from 0.01 to 0.5. The '101 coating is applied by liquid spray and has a thickness of at least 400 nm, a luminous transmittance of less than 35% and a selectivity of at least 1.3. The '102 coating is applied by chemical vapour deposition (CVD) and has a solar factor below 70%.

The use of pyrolysis to form a coating on a substrate generally has the advantage of producing a hard coating with durable abrasion-resistant and corrosion-resistant properties. It is believed that this is due in particular to the fact the process involves deposition of coating material on to a substrate which is hot. Pyrolysis is also generally cheaper than alternative coating processes such as sputtering, particularly in terms of the investment in plant.

Properties of the coated substrate discussed herein are based on the standard definitions of the International Commission on Illumination—Commission Internationale de l'Eclairage ("CIE"). The illuminant for the tests was illuminant C, which represents average daylight having a colour temperature of 6700 K and is especially useful for evaluating the optical properties of glass intended for use in buildings.

The "luminous transmittance" (TL) is the luminous flux transmitted through a substrate as a percentage of the incident luminous flux.

The "luminous reflectance" (RL) is the luminous flux reflected from a substrate as a percentage of the incident luminous flux.

The "purity" (p) of the colour of the substrate refers to the excitation purity in transmission or reflection.

The "dominant wavelength" ($\lambda_D$) is the peak wavelength in the transmitted or reflected range.

The "solar factor" (FS), referring to the transmission of total incident solar radiation through the coated substrate, is the sum of the total energy directly transmitted (TE) and the energy which is absorbed and re-radiated on the side of the coated substrate away from the energy source, as a proportion of the total incident radiant energy.

The "selectivity" of a coated substrate for use in a building glazing panel is the ratio of the luminous transmittance to the solar factor (TL/FS).

It is an object of the present invention to provide a pyrolytically formed coating on a substrate to impart self-cleaning properties possibly combined with solar screening properties and a relatively high reflectance to the substrate.

We have discovered that this and other useful objectives can be achieved by depositing a coating stack comprising a defined overcoat layer on a main layer comprising mainly tin oxide.

According to the invention there is provided a transparent substrate carrying a coating stack comprising a pyrolytically-formed main layer containing oxides of tin possibly doped with antimony and/or fluorine, characterised in that the stack includes an outer layer comprising titanium oxide and having a refractive index in the range 2.0 to 2.8, whereby the so-coated substrate has a reflectance (RL) of more than 10%.

The presence of the outer layer creates an increase of the luminous reflectance (RL) of the coated substrate, increasing the reflectance from the coated side, from less than 10% to more than 10%. According to the present invention, the claimed substrate advantageously has a reflectance greater than 14% but lower than 30%, and preferably lower than 25%. Moreover these increases are achieved without taking the other optical properties of the substrate beyond acceptable limits. The outer layer is also beneficial in further improving the abrasion and corrosion resistance of the coating.

Furthermore, it has been discovered that the presence of the $TiO_2$ outer layer according to the invention induces photocatalytic properties to the coated surface. In particular, the photocatalytic activity is greater than $2.10^{-3}$ $cm^{-1}$ $min^{-1}$ and preferably greater than $5.10^{-3}$ $cm^{-1}$ $min^{-1}$. One of the m common method for measuring this activity is based on the degradation of stearic acid. According to this method, the samples are dipped in a solution of stearic acid in methylic alcohol at room temperature. Then the samples are irradiated by ultraviolet radiations of a frequency of 340 nm in a "QUV Accelerated Weatherin Tester" for 5 minutes with a power of 40 watt/$m^2$ with lamps of the type UVA 340. The FTIR (Fourrier Transform Infrared Spectrophotometer) spectra are obtained every 5 minutes until cumulative time reaches 20 minutes. The slope of the linear regression of the curve "integrated intensity versus UV irradiation time" gives the photocatalytic activity.

It has also been discovered that the presence of the TiO2 layer according to the invention induces hydrophilic properties after UV irradiations. In particular the contact angle with water after 3 hours of irradiation at the temperature of 40° C. in a "QUV Accelerated Weathering Tester" with lamps of the type UVA 340, is lower than 10°, preferably lower than 5°.

Although the invention is described herein primarily with reference to glazing panels for buildings, panels according to the invention are suitable for other applications such as vehicle windows, in particular vehicle sunroofs.

According to some embodiment of the present invention, the outer layer may contain, in addition to the titanium oxide, an oxide of one or more of nickel, tin, zinc and zirconium.

It has been discovered that when the outer coating contains oxide of titanium together with oxide of tin, this confers to the coating a better abrasion and chemical resistance. Such enhancement of the abrasion and chemical resistance is principally important when the coating is applied by liquid pyrolisis. Such a coating contains most preferably at least 50% by volume of tin oxide and at least 30% by volume of titanium oxide.

The preferred geometric thickness for the outer coating is in the range of 10 to 350 nm. The preferred geometric thickness for tin/titanium oxide reflective layer is in the range 40 to 75 nm. If a low RL is wished, for example lower than 20%, it has been discovered that some ranges of thickness are preferable: between 10 and 25 nm, between 90 and 140 nm and between 200 and 300 nm.

In fact, the thickness of each layer has to be chosen in order to obtain the required optical stability. Optical stability means that variations of the thickness of the layer, inherent in industrial production, do not cause significant changes of the optical properties, particularly of Hunter values a and b and purity in reflection.

Advantageously, the claimed coated substrate has neutral tint in reflection. In particular, a good neutral tint is achieved when the Hunter values a and b are comprised between −20 and 5, more preferably between −10 and 0.

When the main layer comprises a Sb/Sn oxide material, good anti-solar properties are further imparted to the coated substrate. The geometric thickness of at least 250 nm for this layer represents an optimum range for a layer in terms of providing solar screening properties sought after and a neutral tint. Preferably the said thickness is lower than 650 nm, for economic and practical reasons. Most preferably, the thickness is in the range 40 to 500 nm, still more preferably in the range 260 to 360 nm and still more preferably between 300 to 330 nm. Such a range permits, in particular, the attainment of coated products with sufficient solar screening properties and presenting optical stability.

Purity in reflection is preferably low, i.e. less than 20%, preferably less than 10%.

As taught in our earlier patent specification GB-A-2302102, when the main layer comprises oxides of tin and antimony, the Sb/Sn molar ratio is preferably in the range 0.01 to 0.5, more preferably in the range 0.03 to 0.21.

As described and claimed in our copending patent application of the same date as the present parent application, when the reflectance of the coated substrate is desired rather high, the main coating layer may contains an additive comprising one or more of aluminum, chromium, cobalt, iron, manganese, magnesium, nickel, titanium, vanadium, zinc and zirconium. The said additive is preferably selected from chromium, iron and magnesium.

The main coating layer may also comprise SnO2 doped with fluorine in place of the main layer described above or in addition to this main layer. In this case low emissivity properties may be obtained in addition to the self-cleaning properties.

In one embodiment of the invention the coating stack further comprises an undercoat positioned between the substrate and the main coating layer. The undercoat serves to improve the aesthetic appeal of the coating both by reducing or eliminating haze in the coating stack and by neutralising the colour that the tin oxide in the main layer tends to impart to the stack.

Suitable materials for the undercoat include one or more silicon oxide or alumina-based coating, for example alumina with a small proportion of vanadium oxide, or aluminum oxinitride. In the case of silicon oxides it is preferred to use an incompletely oxidised material, i.e. $SiO_x$ where x is less than 2, which may have the general structure of $SiO_2$ but has a proportion of gaps which would have been filled with oxygen in the dioxide. This can be achieved by employing oxygen in an insufficient quantity for full oxidation of the undercoat material on the substrate. Our GB patent 2247691 discloses a glass coated with such an incompletely oxidized underlayer. It is also possible to obtain an appropraiate layer with the method described in EP 275 662.

Another purpose of the underlayer is also to prevent the diffusion of alkali metal ion from the glass to the outer layer.

The preferred geometric thickness of the undercoat is in the range 30 to 100 nm, most preferably in the range 60 to 75 nm. This is the range in which the undercoat tends best to impart to the coating stack a neutral tint in reflection.

In a further embodiment of the invention the coating stack also comprises an intermediate layer positioned between the main coating layer and the outer reflective layer. This intermediate layer may have as purpose, the increasing of the luminous reflectance of the coated substrate. In this case, suitable materials for the intermediate layer include oxides of aluminum or silicon, which may be used alone or in admixture. Other intermediate layer may be added in order to impart to the coated substrate other functions, e.g. low emissivity properties. In this case, preferred intermediate layer may comprise SnO2 doped with fluorine.

Preferably, as discussed above, the reflectance (RL) of the coated substrate is at least 14% but not so great as to create glare in reflection. Thus it is preferred that the coated substrate has a maximum reflectance (RL) of 30%, preferably of 25%, most preferably a maximum reflectance of 20%.

It is mostly required that the glazing panel shall transmit a sufficient proportion of visible light in order to allow both good natural illumination inwards into the building or vehicle and good visibility outwards. The light transmittance (TL) of a coated substrate according to the invention is preferably greater than 60%, and more preferably greater than 65%.

It is desirable to increase to a high level the selectivity of the coating, i.e. the ratio of the transmittance to the solar factor. It is preferred that the selectivity is greater than 1.00.

The invention includes within its scope a glazing panel comprising a coated transparent substrate as defined herein. The panel may be a single sheet or alternatively may include two or more substrate sheets in a multiple-glazed or laminated assembly. In a multiple glazing comprising two sheets of glass separated by a gas space, it is preferred that the coating according to the invention be positioned on position 1, which means in contact with the exterior atmosphere. This is in particular the case when self-cleaning properties are searched for. It is also possible, in addition to the coating of the invention, to provide the other faces of the glazing with other coatings. It is in particular interesting to provide the glazing with a solar screening coating on position 2 and/or a low emissivity coating on position 3.

Pyrolytic methods are generally preferred for the application of all the layers of the coating stack of the invention. However, other deposition methods may be envisaged such as sputtering type methods. It is also possible to deposit the main layer and the possible underlayer by pyrolytic method and then to deposit the outer layer by sputtering method.

Coatings produced by pyrolysis are generally advantageous in having a greater mechanical resistance than coatings produced by other methods. The reactant materials to be pyrolysed may be applied to the substrate by chemical vapour deposition (CVD or "vapour pyrolysis") or as a liquid spray ("liquid pyrolysis").

Application of a pyrolytic coating to flat glass is best achieved when the glass is newly formed, e.g. as it leaves a float glass line. This provides economic benefits in avoiding the need to reheat the glass for the pyrolytic reactions to take place, and in the quality of the coating, since the newly formed glass surface is in pristine condition.

Preferably the source of tin for the main layer is selected from $SnCl_2$, $SnCl_4$, $Sn(CH_3)_2Cl_2$, tetramethyl tin or monobutyl trichloro tin ("MBTC"). When the layer is doped with antimony, the source of antimony for the main layer may be selected from $SbCl_5$, $SbCl_3$, organo antimony compounds such as $Sb(OCH_2CH_3)_3$, $ClSb(OCH_2CH_3)_2$, $Cl_2SbOCHClCH_3$, $Cl_2SbOCH_2CHCH_3Cl$ and $Cl_2SbOCH_2C(CH_3)_2Cl$. The source of any metallic additive for the main layer may similarly be a suitable chloride or organo-metallic compound of the respective metal. When the layer is doped with fluorine, the source of fluorine may be, for example hydrofluoric acid or trifluoro-acetic acid ($CF_3COOH$).

For the outer layer based on $TiO_2$, the source of titanium may be, for example, TTIP (titanium tetra-isopropoxide) or $TiCl_4$.

The sources of reactants for the respective layers are preferably formed into single starting mixtures for each of the layers, whereby all of the starting reactants for a given layer are applied simultaneously to the substrate.

To form a coating layer by CVD, the respective reactant mixture is applied, typically through a nozzle, to the substrate in a coating chamber. Where this mixture comprises chlorides which are liquid at ambient temperature, it is vaporised in a heated current of anhydrous carrier gas such as nitrogen. Vaporisation is facilitated by the atomization of these reagents in the carrier gas. To produce the oxides, the chlorides are brought into the presence of a source of oxygen, for instance, water vapour.

Methods and devices for forming such a coating are described for example in French patent No 2348166 or in French patent application No 2648453. These methods and devices lead to the formation of particularly strong coatings with advantageous optical properties.

To form the coating by a spray method, the substrate may be brought into contact with a spray of droplets containing the respective reactant materials. The spray is applied by one or more spray nozzles arranged to follow a path which provides the coating across the width of the ribbon to be coated.

CVD offers benefits over sprayed liquids in providing coatings of regular thickness and composition, such uniformity of the coating being important where the product is to cover a large area. A spray coating also tends to retain traces of the sprayed droplets and of the path of the spray gun. Moreover, the pyrolysis of sprayed liquids is essentially limited to the manufacture of oxide coatings, such as $SnO_2$ and $TiO_2$. It is also difficult to make multi-layer coatings using sprayed liquids because every coating deposition produces a significant cooling of the substrate. Furthermore, CVD is more economic in terms of raw materials, leading to lower wastage.

However despite such disadvantages of the spray method it is nevertheless convenient and inexpensive to apply and employs simple equipment. It is thus often adopted, especially for formation of thick coating layers.

Glazing panels incorporating coated substrates according to the invention may be manufactured as follows. Each pyrolytic coating step may be carried out at a temperature of at least 400° C., ideally from 550° C. to 750° C. The coatings can be formed on a sheet of glass which moves in a tunnel oven or on a glass ribbon during formation, whilst it is still hot. The coatings can be formed inside the lehr which follows the glass ribbon forming device or inside the float tank on the top face of the glass ribbon whilst the latter is floating on a bath of molten tin.

The invention is further described below with reference to the following non-limiting examples.

EXAMPLE 1

A coating stack was applied to clear soda-lime float glass of 6 mm thickness at a series of coating stations each located at a position in a float line where the glass was at an elevated temperature. An undercoat comprising oxides of aluminum and vanadium was first applied by spraying on to the glass, which at this initial stage was at a temperature in excess of 550° C., a solution in glacial acetic acid of 220 g/l aluminum acetylacetonate and 12 g/l vanadium triacetyl-acetonate to form a layer of about 75 nm geometric thickness. Next a main layer, comprising oxides of tin and antimony, was applied by spraying on to the glass, at a temperature of about 550° C., a solution comprising $SnCl_2$ and $SbCl_3$. The proportions of Sn and Sb gave an Sb/Sn ratio in the layer of 0.05 and the formed layer thickness was 430 nm. Finally an overcoat layer comprising oxides of tin and titanium was applied by spraying a solution in dimethylformamide comprising tin dibutylacetate and a titanium chelate formed from octylene glycol titanate and acetylacetone. The overcoat contained 60% $SnO_2$ by volume and 40% $TiO_2$ by volume and had a geometric thickness of 70 nm.

The thus-coated substrate was placed in a frame to form a glazing panel with the coating stack facing outwards. The optical properties of the substrate were measured from the external side.

The properties of the glazing panel were as shown in the accompanying Table.

EXAMPLES 2 TO 11

A coating stack was applied to clear soda-lime float glass of 6 mm thickness at a series of coating stations each located at a position in a float chamber where the glass was at an elevated temperature. An undercoat silicon oxide SiOx was first applied in a coating station located at a position along the float chamber where the glass was at a temperature of about 700° C. The supply line was fed with nitrogen, silane was introduced thereto with a partial pressure of 0.2%, and oxygen was introduced with a partial pressure of 0.36%. A coating of SiOx, where x was approximately equal to 1.78, was obtained with a refractive index of about 1.69. The layer had a geometric thickness as specified in the table. Next a main layer, comprising oxides of tin and antimony, was applied by CVD pyrolysis, using a vaporised reactant mixture of MBTC as the source of tin and $SbCl_3$ as the source of antimony. A tin/antimony oxide coating layer containing tin and antimony in an Sb/Sn molar ratio of 0.05 was formed, in a thickness as specified in the table.

Finally an overcoat layer comprising oxides of tin and titanium was applied by spraying a solution in dimethylformamide comprising tin dibutylacetate and a titanium chelate formed from octylene glycol titanate and acetylacetone. The overcoat contained 60% $SnO_2$ by volume and 40% $TiO_2$ by volume and had a geometric thickness as specified in the table.

The thus-coated substrate was placed in a frame to form a glazing panel with the coating stack facing outwards. The optical properties of the substrate were measured from the external side.

EXAMPLES 12 TO 19

The procedure of examples 12 to 19 was the same as for examples 2 to 11, except that the overcoat layer was made of pure $TiO_2$, starting from titanium chelate formed from octylene glycol titanate and acetylacetone. In examples 16 to 19, the tin/antimony oxide coating layer contains tin and antimony in a Sb/Sn molar ratio of 0.1.

Comparative Examples C.1 to C.10

A coated substrate was prepared as described in Example 2 to 19 but with the difference that no overcoat was applied to the main layer. In comparative examples C1 to C8, the molar ration Sb/Sn in the tin/antimony coating layer was 0.05. In comparative examples C9 and C10, this molar ratio is 0.1. The properties of the so-formed glazing panel are again shown in the accompanying Table.

Comparison of the results shows a significant improvement in the luminous reflectance of the panel, from less than 10% to more than 24% with a pure $TiO_2$ overcoat. The improvement was accompanied by some reduction in luminous transmittance but this was still within acceptable limits.

EXAMPLES 20 TO 26

A SiOx undercoat was applied on a float glass of 6 mm thickness by CVD, as explained in examples 2 to 11. Next, a main layer of tin oxide was deposited by CVD, using MBTC as the source of tin. Finally, an overcoat of TiO2 was applied by CVD starting from vaporized reactant of TTIP as titanium precursor.

EXAMPLE 27

The same main layer (SnO2) and overcoat layer ($TiO_2$) as in examples 20 to 26 were applied but no undercoat was deposited.

EXAMPLES 28 TO 30

A stack: Glass/SiOx/SnO2:Sb (with molar ratio Sb/Sn= 0.05)/TiO2 was applied. The two first layers are deposited in the same way as in examples 2 to 15 and the overcoat layer was deposited as in examples 20 to 26.

EXAMPLE 31

A stack of SiOx/SnO2:Sb (with molar ratio Sb/Sn=0.1)/ TiO2 was applied. The two first layers are deposited in the same way as in examples 16 to 19 and the overcoat layer was deposited as in examples 20 to 26.

EXAMPLE 32 TO 36

The main layer is composed of SnO2 doped with fluorine and is obtained by CVD starting from MBTC as the source of tin and HF as the source of fluorine. A TiO2 overcoat layer was deposited as in examples 20 to 26. In examples 32 to 35 an underlayer of SiOx is applied as explained hereinabove and in example 36, no underlayer is deposited under the main layer.

EXAMPLE 37

The main layer is composed of two layer of SnO2, the first one doped with 5% antimony and the second one with fluorine. The undercoat and overcoat are obtained as explained above for examples 20 to 26.

In all examples 12 to 37, the refractive index of the outer layer is around 2.3 and 2.4.

It is expected that the photocatalytic activity for each stack will vary with the thickness of the outer $TiO_2$ layer. For thicknesses between 12 and 30 nm (examples 12, 14, 16, 18, 20–22, 26, 28, 29, 31–33), the photocatalytic activity should be around $10.10^{-3}$ $cm^{-1}$ $min^{-1}$ and $15.10^{-3}$ $cm^{-1}$ $min^{-1}$. For $TiO_2$ thickness around 40 nm (examples 13, 15, 17, 19, 23, 25), the photocatalytic activity should be around $20.10^{-3}$ $cm^{-1}$ $min^{-1}$. For $TiO_2$ thickness above 100 nm (examples 24, 27, 35 and 36), the excepted photocatalytic activity is around 35 and $40.10^{-3}$ $cm^{-1}$ $min^{-1}$ The thickness of each layer and the properties of each glazing panel are gathered in the following tables.

TABLE 1

| Examples | 1 | 2 | 3 | 4 | 5 | 6 | 7 | 8 | 9 | 10 | 11 |
|---|---|---|---|---|---|---|---|---|---|---|---|
| Undercoat thickness (nm) | 75 | 62.5 | 62.5 | 67.5 | 67.5 | 72.5 | 62.5 | 62.5 | 67.5 | 67.5 | 60 |
| Main layer thickness (nm) | 430 | 342.5 | 342.5 | 342.5 | 342.5 | 342.5 | 347.5 | 347.5 | 347.5 | 347.5 | 350 |
| Overcoat thickness (nm) | 70 | 64 | 68 | 64 | 68 | 62 | 64 | 68 | 64 | 68 | 69 |
| Luminous reflectance (RL) (%) | 21.7 | 18.4 | 18.4 | 18.6 | 18.6 | 18.7 | 18.4 | 18.5 | 18.6 | 18.6 | 18.4 |
| Hunter value in reflection a | 0.1 | 0.44 | −0.53 | −0.2 | −0.95 | −0.3 | −0.62 | −1.61 | −1 | −1.8 | −2.3 |
| Hunter value in reflection b | −2.6 | −3.84 | −2.3 | −3.5 | −2.07 | −3.9 | −3.64 | −2.04 | −3.42 | −1.93 | −1.5 |
| Colour purity in reflection (%) | 4.2 | 6.5 | 4.6 | 6.4 | 4.6 | 7.1 | 7 | 5.1 | 6.9 | 5 | 4.8 |
| $\lambda_D$ in reflection (nm) | 488 | 475 | 480 | 478 | 483 | 478 | 480 | 485 | 481 | 486 | 488 |
| Luminous transmittance (TL) (%) | 42.3 | 64.8 | 64.8 | 64.7 | 64.7 | 64.6 | 64.7 | 64.65 | 64.6 | 64.5 | 64.6 |
| Solar factor (ES) (%) | 42.6 | 59 | 58.8 | 59 | 58.9 | 59.1 | 58.8 | 58.6 | 58.8 | 58.7 | 58.5 |
| Selectivity (TL/FS) | 0.99 | 1.10 | 1.10 | 1.10 | 1.10 | 1.10 | 1.10 | 1.10 | 1.10 | 1.10 | 1.10 |

| Comparative examples | C1 | C2 | C3 | C4 | C5 | C6 |
|---|---|---|---|---|---|---|
| Undercoat thickness (nm) | 62.5 | 67.5 | 72.5 | 62.5 | 67.5 | 60 |
| Main layer thickness (nm) | 342.5 | 342.5 | 342.5 | 347.5 | 347.5 | 350 |
| Luminous reflectance (RL) (%) | 12.7 | 12.5 | 12.3 | 12.7 | 12.5 | 12.8 |
| Hunter value in reflection a | −2.4 | −1.5 | −0.82 | −1.4 | −0.75 | −1.2 |
| Hunter value in reflection b | 2.3 | 1.4 | 0.63 | 2.2 | 1.4 | 2.4 |
| Colour purity in reflection (%) | 4.8 | 3 | 1.2 | 5 | 3.3 | 5.7 |
| $\lambda_D$ in reflection (nm) | 559 | 559 | 552 | 567 | 569 | 569 |
| Luminous transmittance (TL) (%) | 69.9 | 70.1 | 70.2 | 69.7 | 69.9 | 69.6 |
| Solar factor (FS) (%) | 65.4 | 65.4 | 65.3 | 65.2 | 65.2 | 65.1 |
| Selectivity (TL/FS) | 1.07 | 1.07 | 1.08 | 1.07 | 1.07 | 1.07 |

TABLE 2

| Examples | 12 | 13 | 14 | 15 | 16 | 17 | 18 | 19 |
|---|---|---|---|---|---|---|---|---|
| Undercoat thickness (nm) | 70 | 70 | 70 | 70 | 70 | 70 | 70 | 70 |
| Main layer thickness (nm) | 300 | 291.8 | 413.6 | 393.3 | 313.3 | 292.4 | 391.2 | 400 |
| Overcoat thickness (nm) | 25.5 | 40.5 | 27.1 | 45.2 | 21.5 | 39.1 | 28.6 | 50.1 |
| Luminous reflectance (RL) (%) | 19 | 24.6 | 18.3 | 24.4 | 15.4 | 22.6 | 16.7 | 24.5 |
| Hunter value in reflection a | −1.7 | −1.1 | −3.1 | −3.7 | −0.7 | −0.9 | −1.1 | −4.0 |
| Hunter value in reflection b | −4.6 | −3.7 | −7.1 | −5.3 | −4.4 | −4.7 | −9.7 | −3.2 |
| Colour purity in reflection (%) | 9.3 | 6.5 | 14.8 | 10.7 | 9.0 | 8.0 | 17.7 | 8.0 |
| $\lambda_D$ in reflection (nm) | 481.9 | 481.1 | 482.4 | 484.4 | 479.4 | 480.0 | 478.8 | 487.1 |
| Luminous transmittance (TL) (%) | 66.7 | 62.4 | 63.2 | 59.1 | 48.6 | 46.0 | 42.2 | 37.7 |
| Solar factor (FS) (%) | 61.7 | 58.8 | 57.4 | 54.7 | 50.6 | 48.9 | 45.8 | 41.8 |
| Selectivity (TL/FS) | 1.08 | 1.06 | 1.10 | 1.08 | 0.96 | 0.94 | 0.92 | 0.90 |

| Comparative examples | C7 | C8 | C9 | C10 |
|---|---|---|---|---|
| Undercoat thickness (nm) | 70 | 70 | 70 | 70 |
| Main layer thickness (nm) | 300 | 413.6 | 313.3 | 391.2 |
| Luminous reflectance (RL) (%) | 9.8 | 9.5 | 9.5 | 9.2 |
| Hunter value in reflection a | −2.9 | 1.9 | −4.1 | 3.1 |
| Hunter value in reflection b | −2.8 | −3.0 | −1.4 | −2.3 |
| Colour purity in reflection (%) | 9.7 | 5.7 | 8.4 | 6.8 |
| $\lambda_D$ in reflection (nm) | 486.1 | −566.7 | 490.7 | −550.8 |
| Luminous transmittance (TL) (%) | 74.5 | 70.2 | 52.8 | 46.2 |
| Solar factor (FS) (%) | 67.7 | 63.2 | 54.4 | 49.7 |
| Selectivity (TL/FS) | 1.10 | 1.11 | 0.97 | 0.93 |

TABLE 3

| Examples | 20 | 21 | 22 | 23 | 24 | 25 | 26 | 27 |
|---|---|---|---|---|---|---|---|---|
| Undercoat thickness (nm): SiOx | 75 | 75 | 75 | 75 | 65 | 75 | 75 | 0 |
| Main layer thickness (nm): SnO2 | 85 | 300 | 300 | 290 | 140 | 85 | 83 | 65 |
| Overcoat thickness (nm): TiO2 | 12 | 15 | 20 | 40 | 120 | 40 | 20 | 100 |
| Luminous reflectance (RL) (%) | 14 | 15.9 | 17.7 | 24.9 | 16.1 | 22.6 | 16.2 | 17.5 |
| Hunter value in reflection a | −0.4 | −2.1 | −2.1 | −2.0 | −2.9 | −1.6 | −0.7 | −4.2 |
| Hunter value in reflection b | −2.9 | −3.8 | −4.0 | −3.2 | −9.2 | −5.5 | −4.7 | −2.0 |
| Colour purity in reflection (%) | 6.3 | 9.1 | 8.9 | 6.3 | 18.9 | 9.9 | 9.4 | 7.5 |
| $\lambda_D$ in reflection (nm) | 479.1 | 483.3 | 483.1 | 483.9 | 481.2 | 481.1 | 479.2 | 489.5 |
| Luminous transmittance (TL) (%) | 82.8 | 81.1 | 79.3 | 72.4 | 82.4 | 74.6 | 82.3 | 81.0 |
| Solar factor (FS) (%) | 73.9 | 73.1 | 71.4 | 64.6 | 73.6 | 67.8 | 73.5 | 72.3 |
| Selectivity (TL/FS) | 1.12 | 1.11 | 1.11 | 1.12 | 1.12 | 1.10 | 1.12 | 1.12 |

TABLE 4

| Examples | 28 | 29 | 30 | 31 | 32 | 33 | 34 | 35 | 36 | 37 |
|---|---|---|---|---|---|---|---|---|---|---|
| Undercoat thickness (nm): SiOx | 75 | 75 | 75 | 70 | 75 | 30 | 70 | 75 | 0 | 75 |
| Main layer thickness (nm): SnO2:Sb | 280 | 85 | 270 | 290 | 0 | 0 | 0 | 0 | 0 | 250 |
| Main layer thickness (nm): SnO2:F | 0 | 0 | 0 | 0 | 80 | 60 | 280 | 280 | 75 | 250 |
| Overcoat thickness (nm): TiO2 | 12 | 12 | 52 | 15 | 15 | 15 | 40 | 255 | 300 | 150 |
| Luminous reflectance (RL) (%) | 13.0 | 12.9 | 26.8 | 12.7 | 14.9 | 22.7 | 25.0 | 18.6 | 20.0 | 20.7 |
| Hunter value in reflection a | −1.6 | −0.5 | −2.1 | −2.7 | −0.2 | −2.0 | −2.9 | −9.6 | −1.2 | −6.3 |
| Hunter value in reflection b | −5.7 | −4.4 | −1.7 | −5.7 | −3.9 | 1.8 | −3.5 | −4.9 | 1.4 | −8.7 |
| Colour purity in reflection (%) | 13.1 | 9.7 | 4.0 | 14.3 | 7.8 | 2.7 | 7.58 | 17.3 | 2.4 | 18.7 |
| $\lambda_D$ in reflection (nm) | 480.9 | 478.9 | 487.0 | 482.7 | 478.0 | 556.6 | 485.2 | 489.1 | 562.2 | 484.6 |
| Luminous transmittance (TL) (%) | 71.7 | 80.1 | 60.6 | 51.6 | 82 | 74.5 | 72.3 | 78.4 | 77 | 66.2 |
| Solar factor (FS) (%) | 65.2 | 71.5 | 55.1 | 49.1 | 75.2 | 69.6 | 66.3 | 71.9 | 70.6 | 61.3 |
| Selectivity (TL/FS) | 1.10 | 1.12 | 1.10 | 1.05 | 1.09 | 1.07 | 1.09 | 1.09 | 1.09 | 1.08 |

What is claimed is:

1. A transparent substrate carrying a coating stack comprising a pyrolytically-formed main layer comprising oxide of tin, wherein the stack includes an outer layer comprising titanium oxide and having a refractive index in the range 2.0 to 2.8, and an undercoat positioned between the substrate and the main coating layer, whereby the so-coated substrate has a reflectance (RL) of more than 10%, and further characterised by:
   (i) the undercoat imparts to the coated substrate a more neutral tint in reflection; and
   (ii) the Hunter values in reflection of the coated substrate a and b are comprised between −10 and 0.

2. A coated transparent substrate as claimed in claim 1, and further including at least one of (iii) and (iv):
   (iii) the undercoat is selected from oxides of silicon, aluminum oxynitride, and mixtures of oxides of aluminum and vanadium;
   (iv) the undercoat, has a geometric thickness in the range of 30 to 100 nm.

3. A coated transparent substrate as claimed in claim 1, and further including each of (iii) and (iv).

4. A coated transparent substrate as claimed in claim 1, in which the outer layer further contains an oxide of one or more of nickel, tin, zinc, titanium and zirconium.

5. A coated transparent substrate as claimed in claim 1, in which the outer layer has a geometric thickness in the range 10 to 350 nm.

6. A coated transparent substrate as claimed in claim 1, wherein the outer layer has photocatalytic properties, the photocatalytic activity being at least $2.\times 10^{-3}$ cm-1 min$^{-1}$.

7. A coated transparent substrate as claimed in claim 1, wherein the outer layer has photocatalytic properties, the photocatalytic activity being at least $5.\times 10^{-3}$ cm-1 min$^{-1}$.

8. A coated transparent substrate as claimed in claim 1, wherein the outer layer presents, after UV irradiation, hydrophilic properties, the contact angle with water being lower than 10°.

9. A coated transparent substrate as claimed in claim 1, wherein the outer layer presents, after UV irradiation, hydrophilic properties, the contact angle with water being lower than 5°.

10. A coated transparent substrate as claimed in claim 1, in which the main layer has a geometric thickness in the range of 40 to 500 nm.

11. A coated transparent substrate as claimed in claim 1, in which the main layer has a geometric thickness of at least 250 nm.

12. A coated transparent substrate as claimed in claim 1, in which the main layer contains oxides of tin and antimony.

13. A coated transparent substrate as claimed in claim 12, in which the Sb/Sn molar ratio in the main coating layer is in the range of 0.01 to 0.5.

14. A coated transparent substrate as claimed in claim 12, in which the Sb/Sn molar ratio in the main coating layer is in the range of 0.03 to 0.21.

15. A coated transparent substrate as claimed in claim 1, wherein the undercoat is selected from oxides of silicon, aluminum oxinitride, and mixtures of oxides of aluminum and of vanadium.

16. A coated transparent substrate as claimed in claim 1, in which the coating stack further comprises an intermediate layer positioned between the main coating layer and the outer layer.

17. A coated transparent substrate as claimed in claim 16, wherein the intermediate layer comprises aluminum oxide or silicon oxide or $SnO_2$ doped with fluorine.

18. A coated transparent substrate as claimed in claim 1, in which the geometric thickness of the undercoat is in the range 30 to 100 nm.

19. A coated transparent substrate as claimed in claim 1, in which the geometric thickness of the undercoat is in the range 60 to 75 nm.

20. A coated transparent substrate as claimed in claim 1, having a luminous transmittance (TL) of at least 40%.

21. A coated transparent substrate as claimed in claim 1, having a luminous transmittance (TL) of at least 60%.

22. A coated transparent substrate as claimed in claim 1, having a luminous transmittance (TL) of at least 65%.

23. A coated transparent substrate as claimed in claim 1, having a maximum reflectance (RL) of 30%.

24. A coated transparent substrate as claimed in claim 1, having a maximum reflectance (RL) of 25%.

25. A coated transparent substrate as claimed in claim 1, having a maximum reflectance (RL) of 20%.

26. A glazing panel comprising a coated transparent substrate as claimed in claim 1.

27. A glazing panel comprising two or more substrates of sheets of which one is a coated transparent substrate as claimed in claim 1.

28. A building glazing panel as claimed in claim 25.

29. A vehicle window glazing panel as claimed in claim 25.

* * * * *